US010241397B2

(12) United States Patent
Takakuwa et al.

(10) Patent No.: US 10,241,397 B2
(45) Date of Patent: Mar. 26, 2019

(54) IMPRINT APPARATUS AND IMPRINT METHOD

(71) Applicant: Toshiba Memory Corporation, Minato-ku (JP)

(72) Inventors: Manabu Takakuwa, Tsu (JP); Yoshihisa Kawamura, Yokkaichi (JP); Ikuo Yoneda, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 600 days.

(21) Appl. No.: 14/476,904

(22) Filed: Sep. 4, 2014

(65) Prior Publication Data

US 2016/0009020 A1 Jan. 14, 2016

Related U.S. Application Data

(60) Provisional application No. 62/023,614, filed on Jul. 11, 2014.

(51) Int. Cl.
*G03F 7/00* (2006.01)
*H01L 21/027* (2006.01)

(52) U.S. Cl.
CPC ........ *G03F 7/0002* (2013.01); *H01L 21/0273* (2013.01)

(58) Field of Classification Search
CPC ....... B29C 59/00; B29C 59/02; B29C 59/026; G03F 7/075; G03F 7/0002; H01L 21/0273
See application file for complete search history.

(56) References Cited

U.S. PATENT DOCUMENTS

| 5,534,073 A * | 7/1996 | Kinoshita | B25B 11/005 118/725 |
| 6,375,176 B1 * | 4/2002 | Getchel | H01L 21/67103 118/728 |
| 7,607,647 B2 * | 10/2009 | Zhao | B25B 11/005 269/20 |
| 2004/0036850 A1 * | 2/2004 | Tsukamoto | G03F 7/707 355/72 |
| 2006/0272535 A1 * | 12/2006 | Seki | B82Y 10/00 101/492 |

(Continued)

FOREIGN PATENT DOCUMENTS

| JP | 2011-210992 | 10/2011 |
| JP | 2013-120820 | 6/2013 |

(Continued)

*Primary Examiner* — Michael N Orlando
*Assistant Examiner* — Cynthia L Schaller
(74) *Attorney, Agent, or Firm* — Oblon, McClelland, Maier & Neustadt, L.L.P.

(57) ABSTRACT

According to one embodiment, an imprint apparatus including multiple types of imprint units and a conveyor to convey a substrate is provided. Each of the imprint units includes a suction mechanism configured to hold the substrate with multiple suction portions on a substrate holder, and a template having an imprint surface on which a concavo-convex pattern is formed on one face of a template substrate and having a recessed region in the other face, the recessed region corresponding to the imprint surface. The imprint units have different depths of the recessed regions in the templates and different arrangements of the suction portions in the suction mechanisms depending on the types.

4 Claims, 18 Drawing Sheets

(56) References Cited

U.S. PATENT DOCUMENTS

| | | | | |
|---|---|---|---|---|
| 2007/0200276 A1* | 8/2007 | Mackey | ................ | B82Y 10/00 264/293 |
| 2011/0171340 A1* | 7/2011 | Resnick | ................ | B82Y 10/00 425/385 |
| 2013/0112097 A1* | 5/2013 | Nakagawa | ............ | G03F 7/0002 101/483 |

FOREIGN PATENT DOCUMENTS

| | | |
|---|---|---|
| JP | 2013-161816 | 8/2013 |
| JP | 2013-222728 | 10/2013 |

* cited by examiner

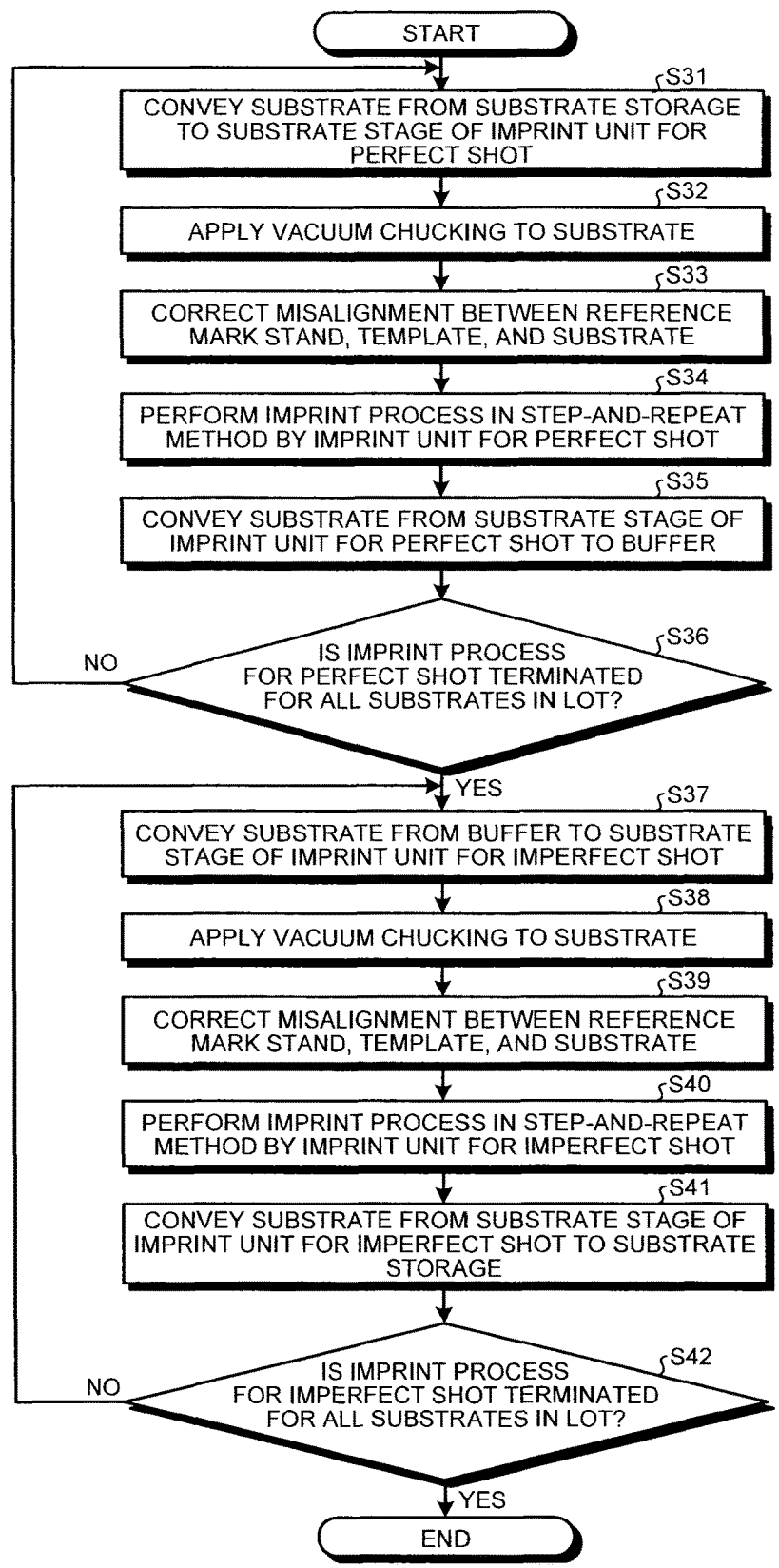

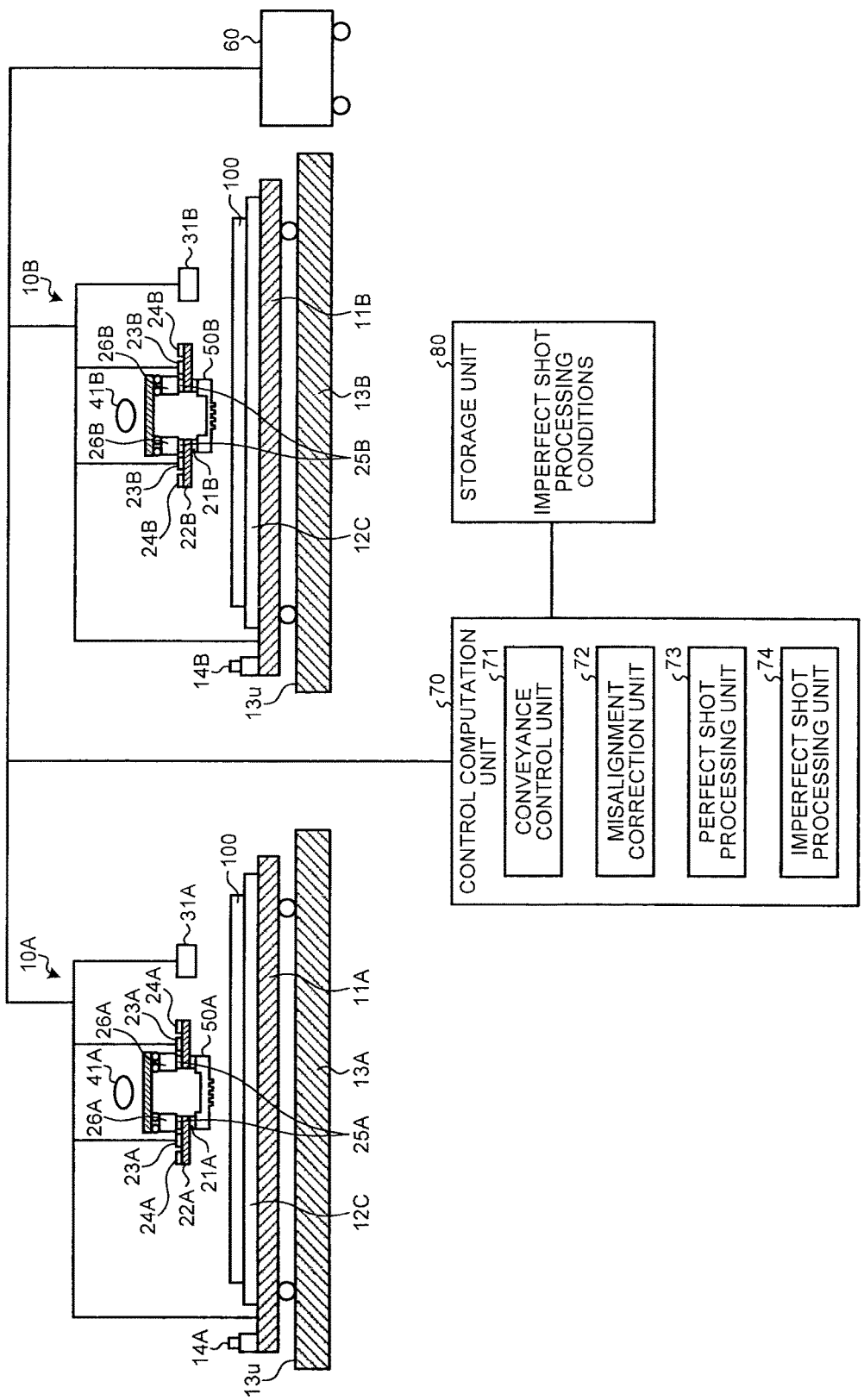

|  | CENTRAL REGION (R1) | INTERMEDIATE REGION (R2) | CIRCUMFERENTIAL REGION (R3) |
|---|---|---|---|
| CHUCK A | PARALLEL CROSSES | PARALLEL CROSSES | CONCENTRIC |
| CHUCK B | RADIAL | RADIAL+ CONCENTRIC | RADIAL+ CONCENTRIC |
| CHUCK C | CONCENTRIC | RADIAL | RADIAL+ CONCENTRIC |
| CHUCK D | RADIAL+PARALLEL CROSSES | CONCENTRIC | CONCENTRIC |

IMPRINT APPARATUS AND IMPRINT METHOD

CROSS-REFERENCE TO RELATED APPLICATIONS

This application is based upon and claims the benefit of priority from U.S. Provisional Application No. 62/023,614, filed on Jul. 11, 2014; the entire contents of which are incorporated herein by reference.

FIELD

Embodiments described herein relate generally to an imprint apparatus and an imprint method.

BACKGROUND

In an imprint apparatus, a wafer to be processed is held on a vacuum chuck provided on a substrate stage, a template with a pattern formed thereon through an imprint agent is pressed against the wafer, the imprint agent is cured, and the template is then released.

In the related art, however, excessive vacuum drawing of wafer with the vacuum chuck causes a defect when releasing the template. In contrast, if the vacuum chuck is made weaker, defects in releasing can be suppressed but the wafer is raised, which causes a vacuum error.

BRIEF DESCRIPTION OF THE DRAWINGS

FIG. 12 is a flowchart illustrating an example of procedures of an imprint method according to the second embodiment;

FIG. 13 is a cross-sectional view schematically illustrating a configuration of an imprint apparatus according to a third embodiment;

DETAILED DESCRIPTION

According to one embodiment, an imprint apparatus including multiple types of imprint units and a conveyor to convey a substrate between the imprint units is provided. Each of the imprint units includes a suction mechanism configured to hold the substrate with multiple suction portions on a substrate holder, and a template having an imprint surface on which a concavo-convex pattern is formed on one face of a template substrate and having a recessed region in the other face, the recessed region corresponding to the imprint surface. The imprint units have different depths of the recessed regions in the templates and different arrangements of the suction portions in the suction mechanisms depending on the types.

Exemplary embodiments of an imprint apparatus and an imprint method will be explained below in detail with reference to the accompanying drawings. The present invention is not limited to the embodiments.

First Embodiment

Figure 1:
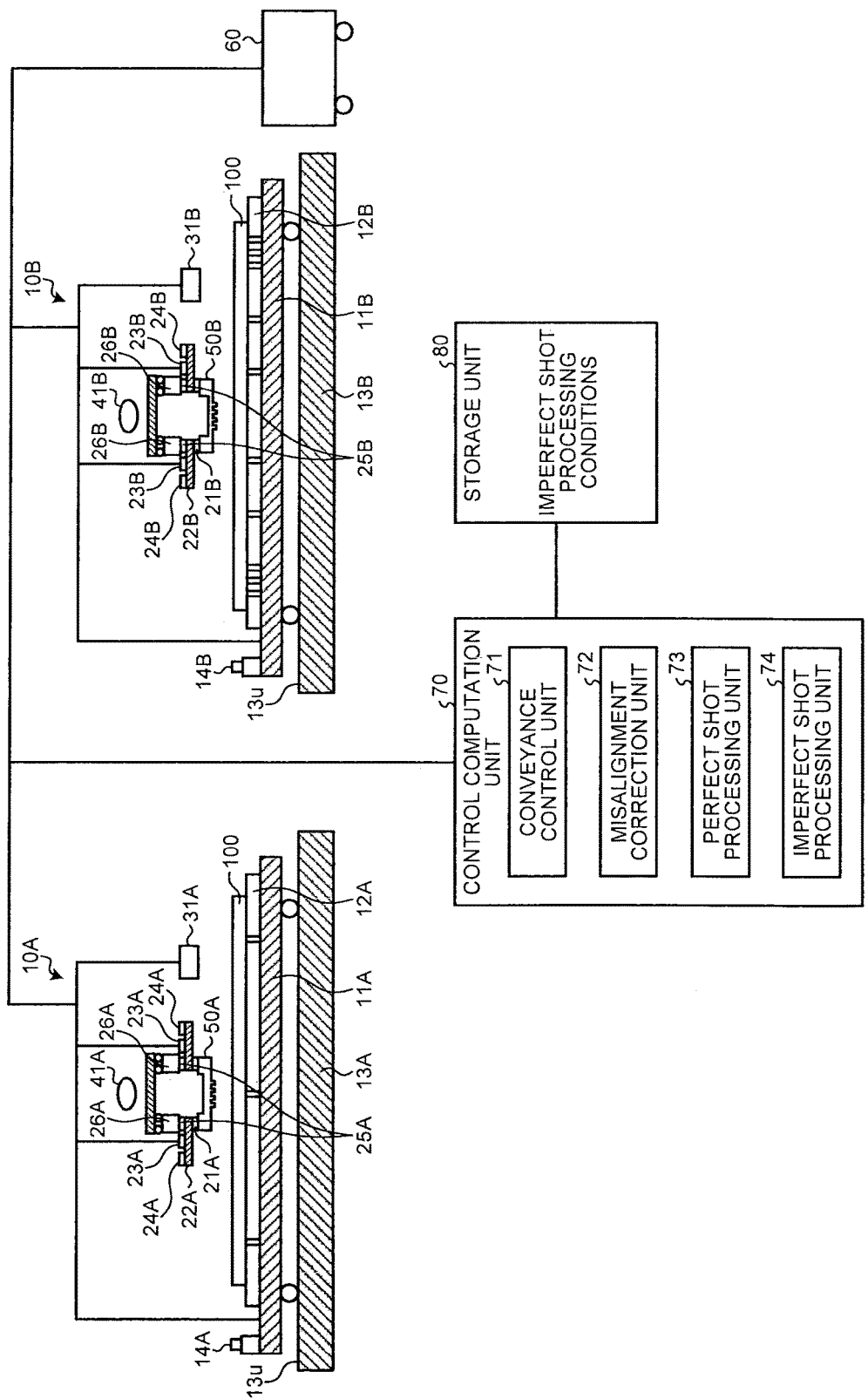
FIG. 1 is a cross-sectional view schematically illustrating an example of a configuration of an imprint apparatus according to a first embodiment.
Figure 2:
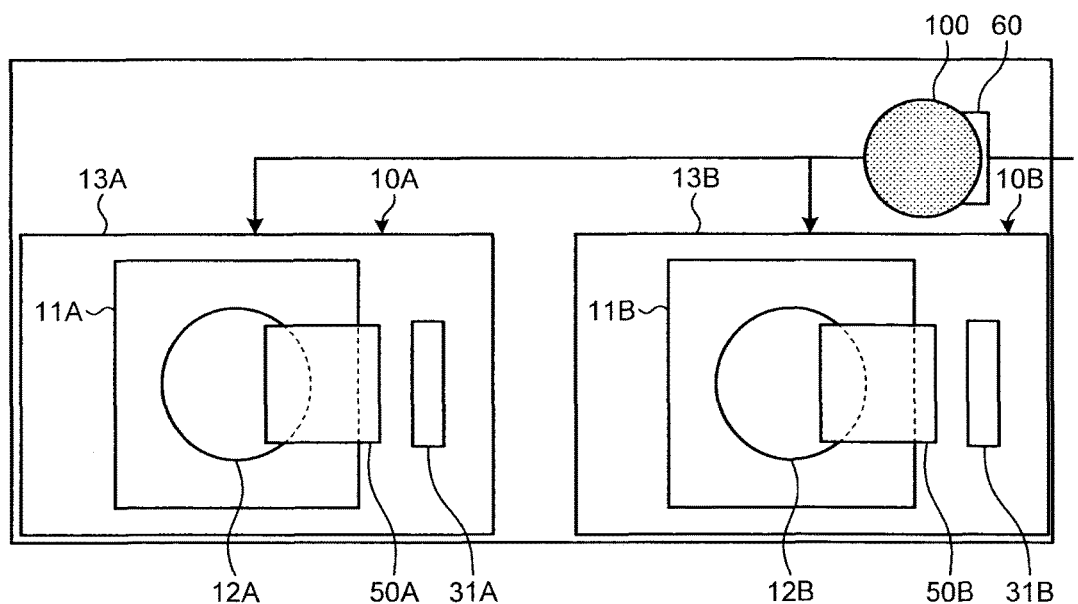
FIG. 2 is a top view of the part of imprint units in FIG. 1.

FIG. 1 is a cross-sectional view schematically illustrating an example of a configuration of an imprint apparatus according to a first embodiment, and FIG. 2 is a top view of the part of imprint units in FIG. 1. The imprint apparatus includes multiple imprint units 10A, 10B having different configurations, a conveyor 60 to carry wafers to be processed out from/into the imprint units 10A, 10B, a control computation unit 70, and a storage unit 80. The imprint units 10A, 10B different from each other include templates (original plates) 50A, 50B and vacuum chuck mechanisms 12A, 12B, respectively, which are different from each other. Herein, a case in which the imprint apparatus is constituted by two imprint units, which are an imprint unit 10A for perfect shot and an imprint unit 10B for imperfect shot, is presented.

The imprint units 10A, 10B include substrate stages 11A, 11B, respectively. The vacuum chuck mechanisms 12A, 12B are provided on the substrate stages 11A, 11B. The vacuum chuck mechanisms 12A, 12B hold a substrate 100. Details of the vacuum chuck mechanisms 12A, 12B will be described later.

The substrate 100 includes a substrate such as a semiconductor substrate, a base pattern formed above the substrate 100, and a processed layer formed above the base pattern. At transfer of the pattern, the substrate 100 further includes an imprint agent (resist) formed on the processed layer. Examples of the processed layer include an insulating film, a metal film (conductive film), and a semiconductor film.

The substrate stages 11A, 11B are provided in a movable manner on stage surface plates 13A, 13B. The substrate stages 11A, 11B are movable along two axes along the top faces 13u of the stage surface plates 13A, 13B. The two axes along the top faces 13u of the stage surface plates 13A, 13B will be referred to as an X axis and a Y axis. The substrate stages 11A, 11B are also movable along a Z axis perpendicular to the X axis and the Y axis. The substrate stages 11A, 11B are preferably rotatable about each of the X axis, the Y axis, and the Z axis.

Reference mark stands 14A, 14B are provided on the substrate stages 11A, 11B. The reference mark stands 14A, 14B have reference marks thereon, which are not illustrated, serving as reference positions of the apparatus. The reference marks are used for calibration of alignment sensors 26A, 26B and positioning (posture control and adjustment) of templates 50A, 50B. The reference marks are the origins on the substrate stages 11A, 11B. X, Y coordinates of a substrate placed on the substrate stages 11A, 11B are coordinates with the origins at the reference mark stands 14A, 14B.

The imprint units 10A, 10B include template stages 21A, 21B. The template stages 21A, 21B fix the templates 50A, 50B by holding edge portions of the templates 50A, 50B by vacuum suction. Herein, the templates 50A, 50B are made of a material that transmits ultraviolet rays such as quartz and fluorite. Transfer patterns made up by concavity and convexity formed on the templates 50A, 50B include a pattern corresponding to a device pattern and a pattern corresponding to alignment marks to be used for positioning of the templates 50A, 50B and the substrate 100. The template stages 21A, 21B operate to position the templates 50A, 50B to the references of the apparatus. The template stages 21A, 21B are attached to base parts 22A, 22B.

The base parts 22A, 22B have correction mechanisms 23A, 23B and pressure portions 24A, 24B attached thereto. The correction mechanisms 23A, 23B have adjustment mechanisms to finely adjust the positions (postures) of the templates 50A, 50B in response to an instruction from the control computation unit 70, for example. The correction mechanisms 23A, 23B correct relative positions of the templates 50A, 50B and the substrate 100 by finely adjusting the positions (postures) of the templates 50A, 50B. When the template patterns of the templates 50A, 50B are pressed against the resist above the substrate 100, the pressure portions 24A, 24B apply pressure to the vicinities of the templates 50A, 50B.

The base parts 22A, 22B are attached to alignment stages 25A, 25B. For positioning of the templates 50A, 50B and the substrate 100, the alignment stages 25A, 25B can move the base parts 22A, 22B in the X-axis direction and in the Y-axis direction. The alignment stages 25A, 25B also have a function of turning the base parts 22A, 22B along the XY plane.

The alignment stages 25A, 25B are provided with alignment sensors 26A, 26B. The alignment sensors 26A, 26B detect misalignment of the templates 50A, 50B with respect to the reference marks on the reference mark stands 14A, 14B and misalignment of the substrate 100 with respect to the templates 50A, 50B. The detection results are sent to the control computation unit 70. Although a case in which two alignment sensors 26A, 26B are arranged on the left and on the right is illustrated in FIG. 1, the number of alignment sensors is preferably four or more.

For detecting misalignment of the templates 50A, 50B with respect to the reference marks, the reference marks that are not illustrated and the alignment marks that are provided on the templates 50A, 50B and that are not illustrated are used. The reference marks and the alignment marks on the templates 50A, 50B are diffraction gratings, for example. Light emitted to, diffracted by and reflected by the reference marks and the alignment marks on the templates 50A, 50B are detected by the alignment sensors 26A, 26B.

For detecting misalignment of the substrates 100 with respect to the templates 50A, 50B, the alignment marks that are not illustrated and that are provided on the templates 50A, 50B and an alignment mark that are not illustrated and that is provided above the substrate 100 are used. The alignment marks are diffraction gratings, for example. Light emitted to, diffracted by and reflected by the alignment marks are detected by the alignment sensors 26A, 26B.

The imprint units 10A, 10B include inkjet heads 31A, 31B at positions opposed to the substrate stages 11A, 11B. The inkjet heads 31A, 31B drip the imprint agent made of resin onto the substrate 100. For example, the inkjet heads 31A, 31B have nozzles, and drips the imprint agent through the nozzles onto the substrate 100. For the imprint agent, an ultraviolet curable resin may be used, for example. Note that the method for supplying the imprint agent onto the substrate 100 is not limited thereto.

The imprint units 10A, 10B include light sources 41A, 41B to emit light (such as ultraviolet rays) for curing the imprint agent when the templates 50A, 50B are pressed against the substrate 100 with the imprint agent therebetween. The light sources 41A, 41B may be arranged immediately above the templates 50A, 50B or may be arranged at positions other than immediately above the templates 50A, 50B so that light is emitted toward immediately above the templates 50A, 50B by using optical members such as mirrors.

As described above, in the first embodiment, the imprint units 10A, 10B include the imprint unit 10A for perfect shot and the imprint unit 10B for imperfect shot. The imprint unit 10A for perfect shot performs an imprint process on regions of the substrate 100 to which the entire pattern formed on the template 50A is transferred. Such regions are present around the center of the substrate 100 and will be referred to as perfect shot regions below. The imprint unit 10B for imperfect shot performs an imprint process on regions of the substrate 100 out of which part of the pattern formed on the template 50B sticks. Such regions are present at the edge of the substrate 100 and will be referred to as imperfect shot regions below.

Figure 3:
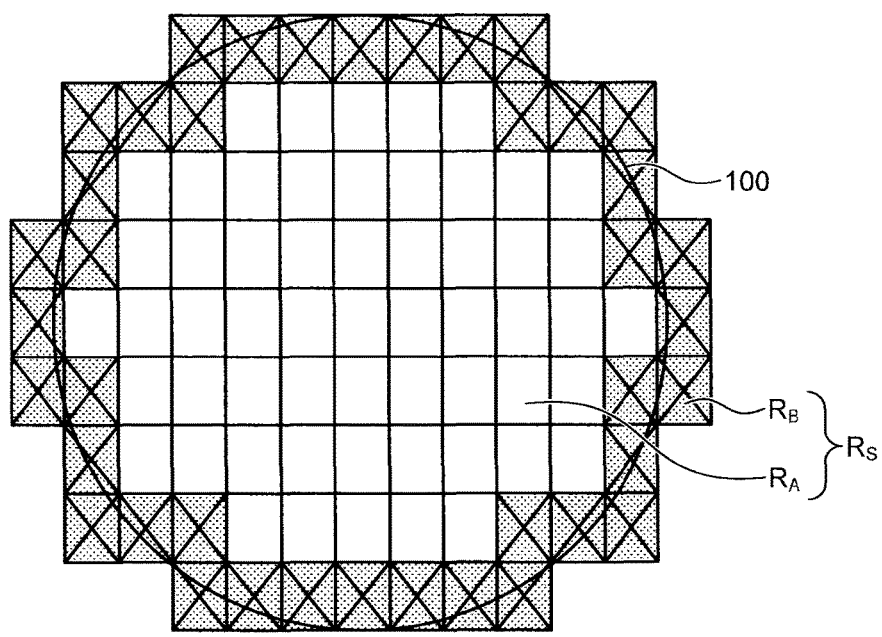
FIG. 3 is a diagram illustrating an example of shot regions in a substrate.

FIG. 3 is a diagram illustrating an example of shot regions in a substrate. Here, a top view of a circular wafer is illustrated as the substrate 100. Rectangular frames presented over the substrate 100 represent shot regions $R_S$. Shot regions $R_S$ that are fully within the substrate 100 are referred to as perfect shot regions $R_A$ and represented by rectangles without hatching in FIG. 3. Shot regions $R_S$ that partially stick out from the substrate 100 are referred to as imperfect shot regions $R_B$ and represented by rectangles with hatching and crosses in FIG. 3.

Figure 4A:
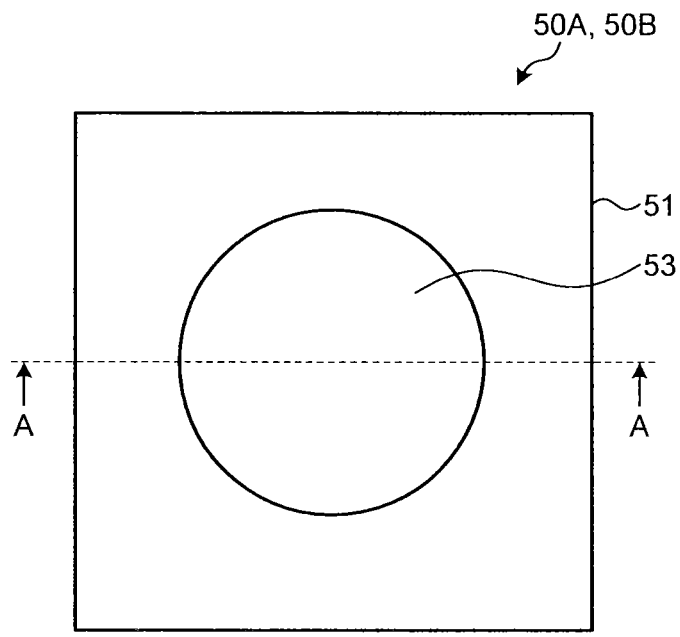
FIGS. 4A and 4B are diagrams illustrating an example of a structure of a template.
Figure 4B:
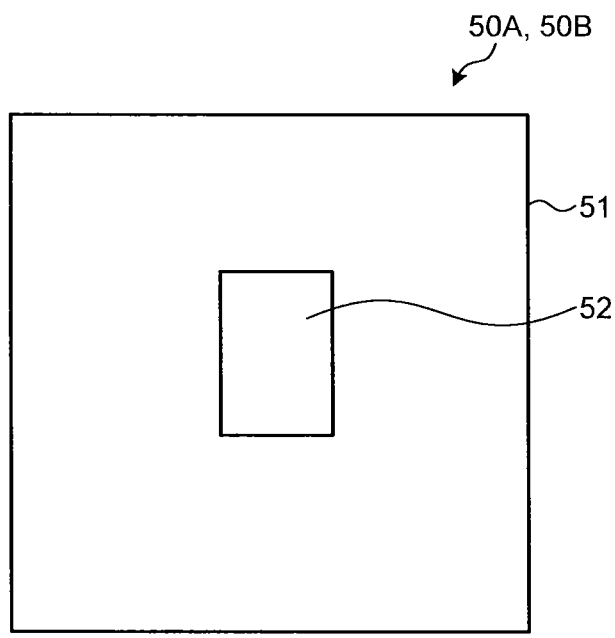

FIGS. 4A and 4B are diagrams illustrating an example of a structure of a template. FIG. 4A is a top view illustrating an example of the template, and FIG. 4B is a bottom view illustrating the example of the template. The templates 50A, 50B are each made of a rectangular template substrate 51. An imprint surface 52 is arranged around the center of the bottom face of the template substrate 51. The imprint surface 52 has a pattern of concavo-convex reverse to that to be formed on a target to be processed. The size of the imprint surface 52 is the same as that of a shot region. In contrast, an area of the top face of the template substrate 51 including the center thereof is recessed. As a result, a recessed portion 53 (cavity) is formed in the top face of the template substrate 51. The recessed portion 53 is provided to contain a region corresponding to the imprint surface 52 on the bottom face.

As described above, in the first embodiment, the structures of the templates 50A, 50B and the configurations of the vacuum chuck mechanisms 12A, 12B provided on the substrate stages 11A, 11B are different between the imprint unit 10A for perfect shot and the imprint unit 10B for imperfect shot.

Figure 5:
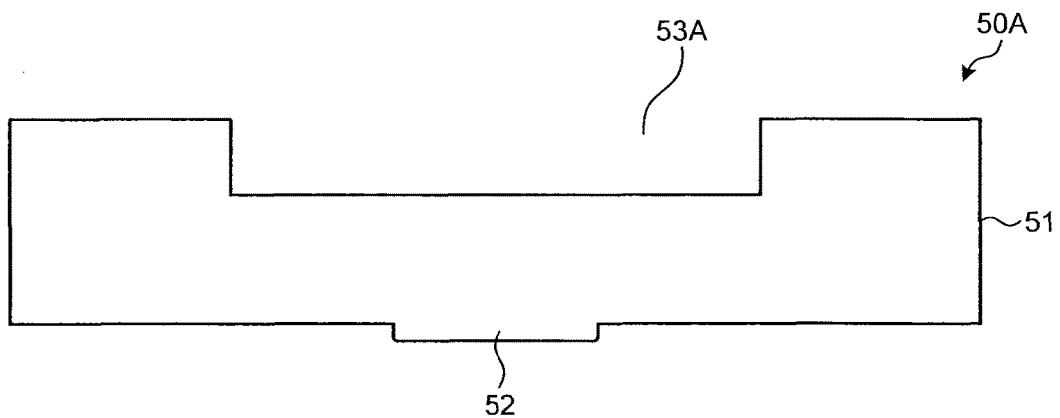
FIG. 5 is a cross-sectional view schematically illustrating an example of the structure of a template in an imprint unit for perfect shot.

FIG. 5 is a cross-sectional view schematically illustrating an example of the structure of the template in the imprint unit for perfect shot, which is a cross-sectional view taken along A-A in FIG. 4A. In the imprint unit 10A for perfect shot, the depth of the recessed portion 53A provided in the template 50A is smaller than half of the thickness of the template substrate 51. The thickness of the template substrate 51 at the position where the recessed portion 53A is formed is preferably 10% to 50% of the thickness of the template substrate 51. If the thickness is smaller than 10%, the template and the target to be processed are not separated and the target to be processed cannot be sucked by the vacuum chuck mechanism, which causes an apparatus error. If the thickness is larger than 50%, a defect in drawing is likely to occur when the template is released. In this manner, since the thickness of the template substrate 51 is small at the position where the imprint surface 52 is provided, the template substrate 51 can be slightly warped at this portion. This facilitates drawing of the template substrate 51 from the target to be processed after the imprint process.

Figure 6A:
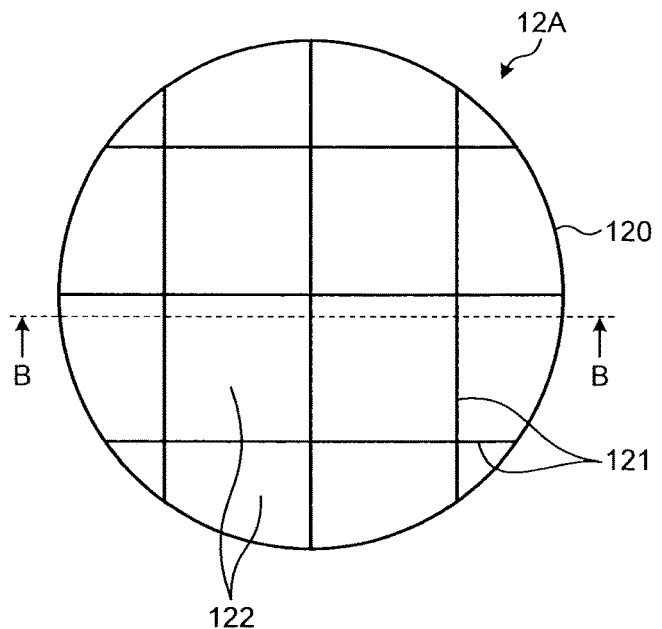
FIGS. 6A to 6C are diagrams schematically illustrating an example of a structure of a vacuum chuck mechanism in the imprint unit for perfect shot.
Figure 6B:
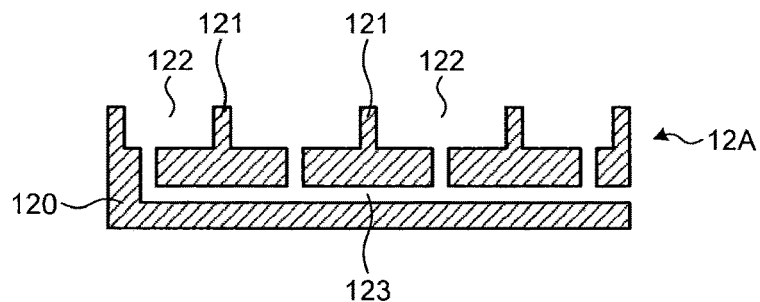
Figure 6C:
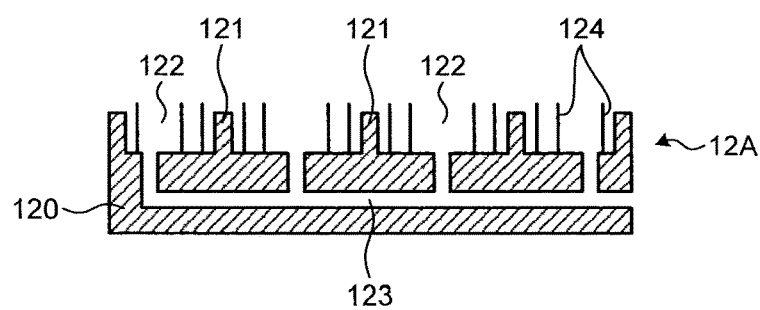

FIGS. 6A to 6C are diagrams schematically illustrating an example of a structure of a vacuum chuck mechanism in the imprint unit for perfect shot; FIG. 6A is a top view schematically illustrating an example of the structure of the vacuum chuck mechanism of the imprint unit for perfect shot, FIG. 6B is a cross-sectional view taken along B-B in FIG. 6A, and FIG. 6C is a cross-sectional view taken along B-B in FIG. 6A illustrating an example structure different from that of FIG. 6B. In the imprint unit 10A for perfect shot, the vacuum chuck mechanism 12A provided on the substrate stage 11A has recessed portions 122 serving as suction portions provided in a top face of a plate member 120 and having a predetermined depth, partition portions 121 that separate the recessed portions 122 from one another, and a suction passage 123 provided inside of the plate member 120 and connected to the bottoms of the recessed portions 122. An end of the suction passage 123 is provided at a side face of the plate member 120, for example. The suction passage 123 is connected to an exhauster such as a vacuum pump that is not illustrated. In the imprint unit 10A for perfect shot, the partition positions 121 are in parallel crosses. As illustrated in FIG. 6C, the recessed portions 122 may be provided with support pins 124 of the same height as the partition portions 121. Provision of the support pins 124 allows the substrate 100 to be supported at the same height as the partition portions 121.

The directions in which the partition portions 121 in parallel crosses extend is preferably the same as the directions of circumferential sides of the template substrate 51 to be pressed. This is because pressing of the template 50A against the target to be processed becomes stable in the perfect shot regions $R_A$ by supporting the target to be processed in the directions of the sides of the template substrate 51. This results in easier control of the imprint process.

Figure 7:
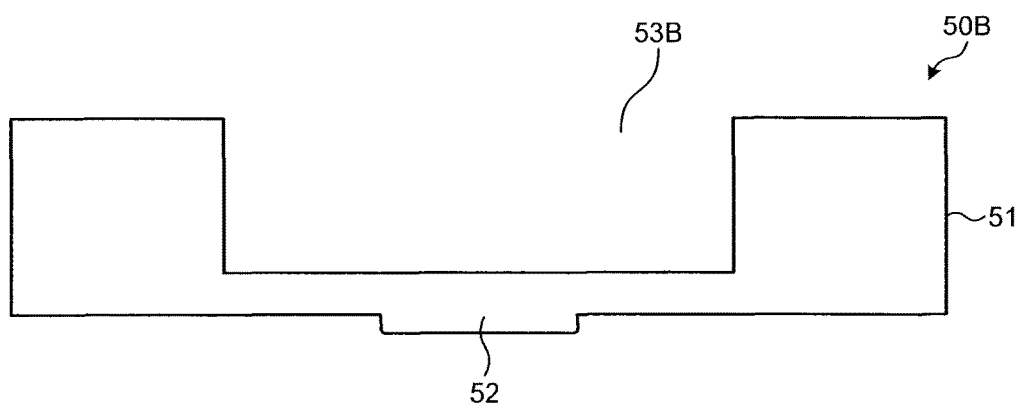
FIG. 7 is a cross-sectional view schematically illustrating an example of a template in an imperfect shot imprint unit.

FIG. 7 is a cross-sectional view schematically illustrating an example of the structure of the template in the imprint unit for imperfect shot, which is a cross-sectional view taken along A-A in FIG. 4A. In the template 50B of the imprint unit 10B for imperfect shot, the depth of the recessed portion 53 is larger than that of the template 50A of the imprint unit 10A for perfect shot. The depth of the recessed portion 53B provided in the template 50B is larger than half of the thickness of the template substrate 51. The thickness of the template substrate 51 at the position where the recessed portion 53B is formed is preferably 5% to 45% of the thickness of the template substrate 51. If the thickness is smaller than 5%, the template and the target to be processed are not separated and the target to be processed cannot be sucked by the vacuum chuck mechanism, which causes an apparatus error. If the thickness is larger than 45%, a defect in drawing is likely to occur when the template is released. In this manner, since the thickness of the template substrate 51 at the position where the imprint surface 52 is provided is made smaller than that of the template 50A of the imprint unit 10A for perfect shot, the template substrate 51 can be warped at this portion further than the template 50A. This further facilitates drawing of the template substrate 51 from the target to be processed after the imprint process.

Figure 8A:
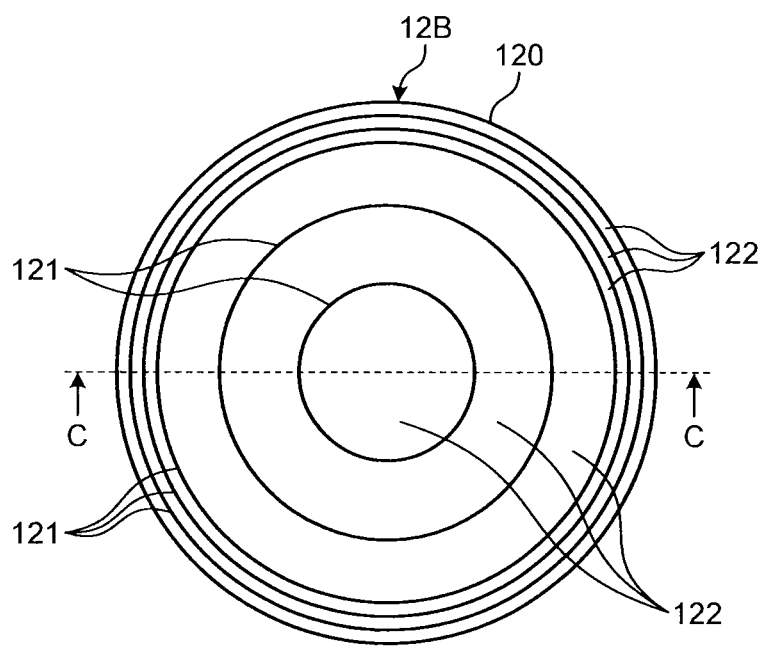
FIGS. 8A and 8B are diagrams schematically illustrating an example of a vacuum chuck mechanism in the imperfect shot imprint unit.
Figure 8B:
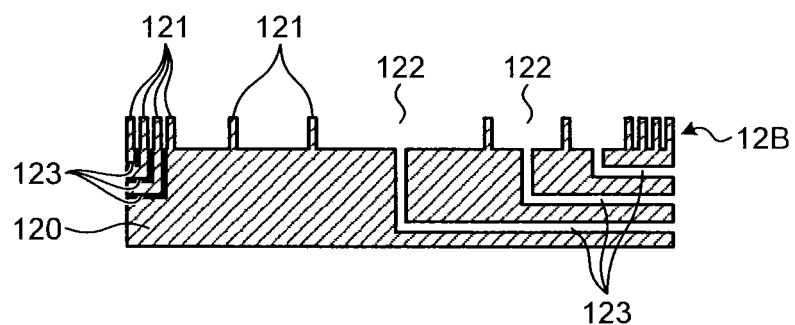

FIGS. 8A and 8B are diagrams schematically illustrating an example of a vacuum chuck mechanism in the imprint unit for imperfect shot. FIG. 8A is a top view schematically illustrating an example of the structure of the vacuum chuck mechanism in the imprint unit for imperfect shot, and FIG. 8B is a cross-sectional view taken along C-C in FIG. 8A. In the imprint unit 10B for imperfect shot, the vacuum chuck mechanism 12B provided on the substrate stage 11B has recessed portions 122 serving as suction portions provided in a top face of a plate member 120 and having a predetermined depth, partition portions 121 that separate the recessed portions 122 from one another, and a suction passage 123 provided inside of the plate member 120 and connected to the bottoms of the recessed portions 122. In the imprint unit 10B for imperfect shot, the partition portions 121 are provided concentrically. Thus, the recessed portion 122 surrounded by the innermost partition portion 121 has a columnar shape, and the recessed portions 122 surrounded by the other partition portions 121 have annular shapes. A suction passage 123 is provided for each recessed portion 122. Thus, the suction passages are provided in the recessed portions 122 on a one-to-one basis. This allows selection of whether or not to apply vacuum drawing for each of the recessed portions 122. As a result, the manner in which vacuum suction is applied can be changed depending on the position to be imprinted. For example, as illustrated in FIG. 3, imperfect shot regions $R_B$ are present at various positions at the edge of the substrate 100. The recessed portions 122 are thus arranged at higher density at the edge of the substrate 100 so that the edge of the substrate 100 is not raised during the imprint process. Ends of the suction passages 123 are provided at a side face of the plate member 120, for example. The suction passages 123 are connected to an exhauster such as a vacuum pump that is not illustrated. Similarly to FIG. 6C, the recessed portions 122 may also be provided with support pins in the imprint unit 10B for imperfect shot.

Referring back to FIGS. 1 and 2, the configuration of the imprint apparatus will be described. The conveyor 60 conveys the substrate 100 between the imprint units 10A, 10B.

For example, the conveyor 60 sequentially performs, for each of substrates 100 in one lot, the process of first conveying the substrate 100 to the imprint unit 10A for perfect shot and then conveying the substrate 100 to the imprint unit 10B for imperfect shot after the imprint process at the imprint unit 10A for perfect shot is completed.

The control computation unit 70 includes a conveyance control unit 71, a misalignment correction unit 72, a perfect shot processing unit 73, and an imperfect shot processing unit 74. The conveyance control unit 71 issues an instruction for conveying a substrate 100 between a substrate storage, which is not illustrated, storing the substrates 100 in units of a lot, the imprint unit 10A for perfect shot, and the imprint unit 10B for imperfect shot. For example, the conveyance control unit 71 issues an instruction for conveying a substrate 100 from the substrate storage to the substrate stage 11A of the imprint unit 10A for perfect shot. After the imprint process on perfect shot regions $R_A$ is terminated, the conveyance control unit 71 then issues an instruction for conveying the substrate 100 from the imprint unit 10A for perfect shot to the substrate stage 11B of the imprint unit 10B for imperfect shot. After the imprint process on imperfect shot regions $R_B$ is terminated, the conveyance control unit 71 further issues an instruction for conveying the substrate 100 from the imprint unit 10B for imperfect shot to the substrate storage.

The misalignment correction unit 72 calculates misalignment of the templates 50A, 50B with respect to the reference marks on the reference mark stands 14A, 14B and misalignment of the substrate 100 with respect to the templates 50A, 50B on the basis of information from alignment sensors 26A, 26B. On the basis of the misalignments, the misalignment correction unit 72 then sends an instruction for alignment of the reference mark stands 14A, 14B and the templates 50A, 50B and an instruction for alignment of the templates 50A, 50B and the substrate 100 to the alignment stages 25A, 25B and the substrate stages 11A, 11B of the imprint units 10A, 10B.

The perfect shot processing unit 73 sends an instruction to perform the imprint process to the imprint unit 10A for perfect shot. The imperfect shot processing unit 74 sends an instruction to perform the imprint process to the imprint unit 10B for imperfect shot. The imperfect shot processing unit 74 also controls on/off of vacuum drawing of the recessed portions 122 depending on the positions of the imperfect shot regions $R_B$ according to the positions of the imperfect shot regions $R_B$ to be subjected to the imprint process and imperfect shot processing conditions indicating on/off of vacuum drawing of the recessed portions 122.

Figure 9:
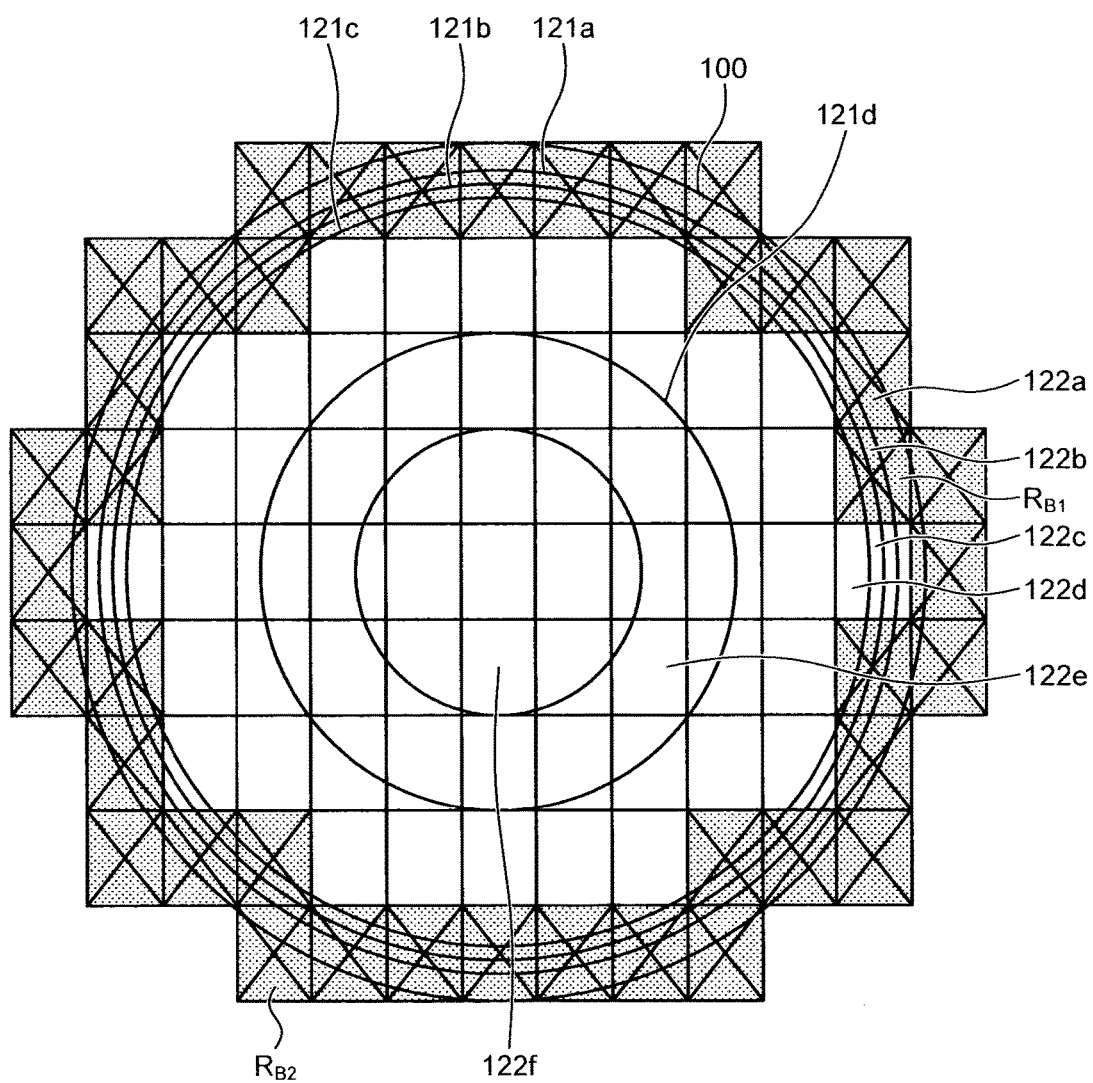
FIG. 9 is a diagram schematically illustrating an example of positional relations between a substrate, shot regions, and annular partitions.

The storage unit 80 stores the imperfect shot processing conditions. FIG. 9 is a diagram schematically illustrating an example of positional relations between a substrate, shot regions, and annular partitions. The amounts by which the imperfect shot regions $R_B$ overlap with the substrate 100 differ depending on the positions. As described above, the partition portions 121 are arranged at a higher density at the edge than the center of the vacuum chuck mechanisms 12A, 12B. Thus, the manner of vacuum drawing when the templates 50A, 50B are pressed can be varied depending on the positions of the imperfect shot regions $R_B$. Specifically, whether or not to apply vacuum drawing at the recessed portions 122a to 122c present under the imperfect shot regions $R_B$ is adjusted so that the substrate 100 is in a sucked state according to the proportions in which the substrate 100 is contained in the imperfect shot regions $R_B$. Whether or not to apply vacuum drawing at the recessed portions 122a to 122c depending on the positions of the imperfect shot regions $R_B$ is indicated by the imperfect shot processing conditions. Note that the recessed portions 122a to 122c are separated by the partition portions 121a to 121d.

For example, most of an imperfect shot region $R_{B1}$ in FIG. 9 overlaps with the substrate 100. In addition, four recessed portions 122a to 122d pass through this imperfect shot region $R_{B1}$. If all of the recessed portions 122a to 122d are subjected to vacuum drawing and chucking in the imprint process, the suction becomes excessive and may cause a defect in drawing of the template 50B. In contrast, since the imperfect shot region $R_{B1}$ is at the edge of the substrate 100, the substrate 100 may be raised if the suction is too weak. Thus, three recessed portions 122a, 122c, and 122d out of the four recessed portions 122a to 122d are used for chucking, for example, which can prevent defects in drawing from being caused and also prevent the edge of the substrate 100 from being raised in the imprint process.

About a half of an imperfect shot region $R_{B2}$ in FIG. 9 overlaps with the substrate 100, and the other half thereof sticks out from the substrate 100. In addition, two recessed portions 122a, 122b pass through the imperfect shot region $R_{B2}$. In this case, both of the two recessed portions 122a, 122b are used for chucking to prevent the edge of the substrate 100 from being raised in the imprint process.

As a result of controlling whether or not to apply vacuum drawing of the recessed portions 122a to 122f depending on the positions of the imperfect shot regions $R_B$ in this manner, both of defects caused during the imprint process and rise of the edge of the substrate 100 can be prevented.

Figure 10:
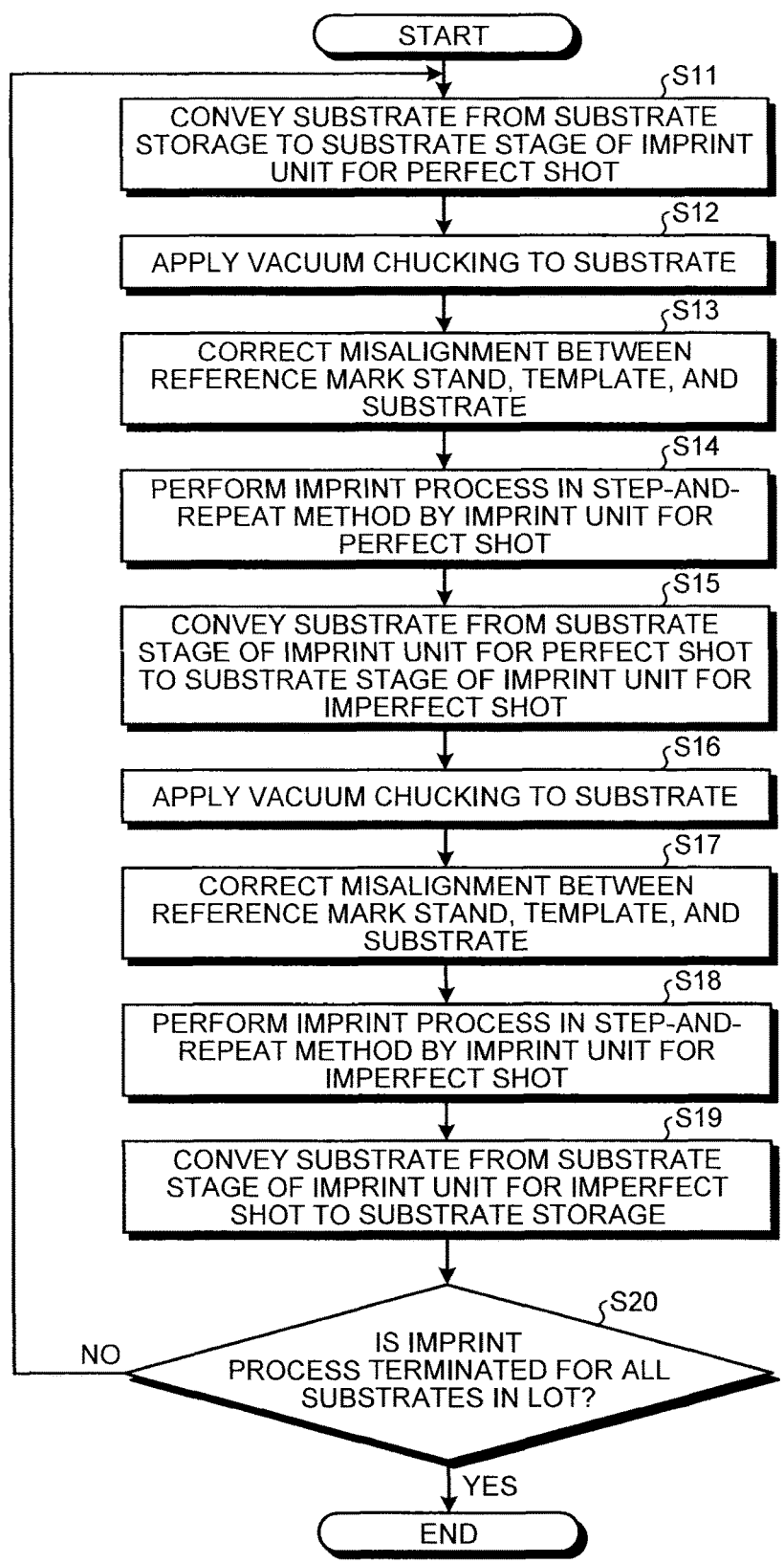
FIG. 10 is a flowchart illustrating an example of procedures of an imprint method according to the first embodiment.

Next, the imprint process with such an imprint apparatus will be explained. FIG. 10 is a flowchart illustrating an example of procedures of an imprint method according to the first embodiment. First, when the substrate storage of one lot is placed at a predetermined position near the imprint apparatus, the imprint process is started. The conveyor 60 conveys a substrate 100 from the substrate storage to the substrate stage 11A of the imprint unit 10A for perfect shot (step S11). This is performed according to an instruction from the conveyance control unit 71 of the control computation unit 70. Subsequently, the substrate 100 fixed by the vacuum chuck mechanism 12A of the imprint unit 10A for perfect shot is subjected to vacuum chucking (step S12). Thereafter, the misalignment correction unit 72 of the control computation unit 70 calculates misalignment between the reference mark stand 14A, the template 50A, and the substrate 100, and corrects the misalignment on the basis of the calculation result (step S13).

Subsequently, the imprint process in the step-and-repeat method is performed by the imprint unit 10A for perfect shot (step S14). For example, the imprint agent is dripped from the inkjet head 31A onto a perfect shot region $R_A$ of the substrate 100. Subsequently, the template 50A is moved and positioned onto the perfect shot region onto which the imprint agent is dripped. Thereafter, the imprint surface 52 is pressed against the perfect shot region $R_A$ onto which the imprint agent is dripped. Subsequently, ultraviolet rays, for example, are emitted from the light source 41A to cure the imprint agent. The template 50A is then released from the substrate 100. As a result, a concavo-convex pattern made of the cured imprint agent is formed on the perfect shot region $R_A$. The imprint process is then repeated until there remain no perfect shot regions $R_A$ on which the concavo-convex pattern is not formed.

Thereafter, the conveyor 60 conveys the substrate 100 from the substrate stage 11A of the imprint unit 10A for perfect shot to the substrate stage 11B of the imprint unit 10B for imperfect shot (step S15). This is performed according to an instruction from the conveyance control unit 71 of the control computation unit 70. Subsequently, the substrate 100 placed by the vacuum chuck mechanism 12B of the imprint unit 10B for imperfect shot is subjected to vacuum chucking (step S16). Thereafter, the misalignment correction unit 72 of the control computation unit 70 calculates misalignment between the reference mark stand 14B, the template 50B, and the substrate 100, and corrects the misalignment on the basis of the calculation result (step S17).

Subsequently, the imprint process in the step-and-repeat method is performed by the imprint unit 10B for imperfect shot (step S18). For example, the imprint agent is dripped from the inkjet head 31B onto an imperfect shot region $R_B$ of the substrate 100. Subsequently, the manner of vacuum chucking is selected according to the imperfect shot processing conditions (recessed portions 122 to be subjected to vacuum drawing are selected). Subsequently, the template 50B is moved and positioned onto the imperfect shot region onto which the imprint agent is dripped. Thereafter, the imprint surface 52 is pressed against the perfect shot region $R_B$ onto which the imprint agent is dripped. Subsequently, ultraviolet rays, for example, are emitted from the light source 41B to cure the imprint agent. The template 50B is then released from the substrate 100. As a result, a concavo-convex pattern made of the cured imprint agent is formed on the imperfect shot region $R_B$. The imprint process is then repeated until there remain no imperfect shot regions $R_B$ on which the concavo-convex pattern is not formed.

The conveyor 60 then conveys the substrate 100 from the substrate stage 11B of the imprint unit 10B for imperfect shot to the substrate storage (step S19). Subsequently, it is determined whether the imprint process is terminated for all the substrates 100 in the lot (step S20). If the imprint process is not terminated for all the substrates 100 (No in step S20), the process returns to step S11 and a next substrate 100 in the lot is processed. If the imprint process is terminated for all the substrates 100 (Yes in step S20), the process is terminated.

In the explanation above, after performing the perfect shot and imprint processes for imperfect shot on one substrate 100 in the lot, the perfect shot and imprint processes for imperfect shot are performed on a next substrate 100. It is, however, possible to perform the imprint process on one substrate 100 at the imprint unit 10B for imperfect shot while performing the imprint process on another substrate 100 at the imprint unit 10A for perfect shot at the same time.

Furthermore, although the imprint processes are performed in the order of the imprint unit 10A for perfect shot and the imprint unit 10B for imperfect shot in the explanation above, the order may be reversed.

In the first embodiment, the imprint processes are performed on the perfect shot regions $R_A$ and the imperfect shot regions $R_B$ by using the imprint units 10A, 10B having different templates 50A, 50B and vacuum chuck mechanisms 12A, 12B. Since different templates 50A, 50B and different vacuum chuck mechanisms 12A, 12B are used depending on the positions subjected to the imprint process, it is possible to reduce defects of the substrate 100 occurring when the templates 50A, 50B are drawing in each of the regions. Furthermore, since the templates 50A, 50B can be made easier to be drawn, it is also possible to achieve longer lifetime of the templates 50A, 50B.

Second Embodiment

Figure 11:
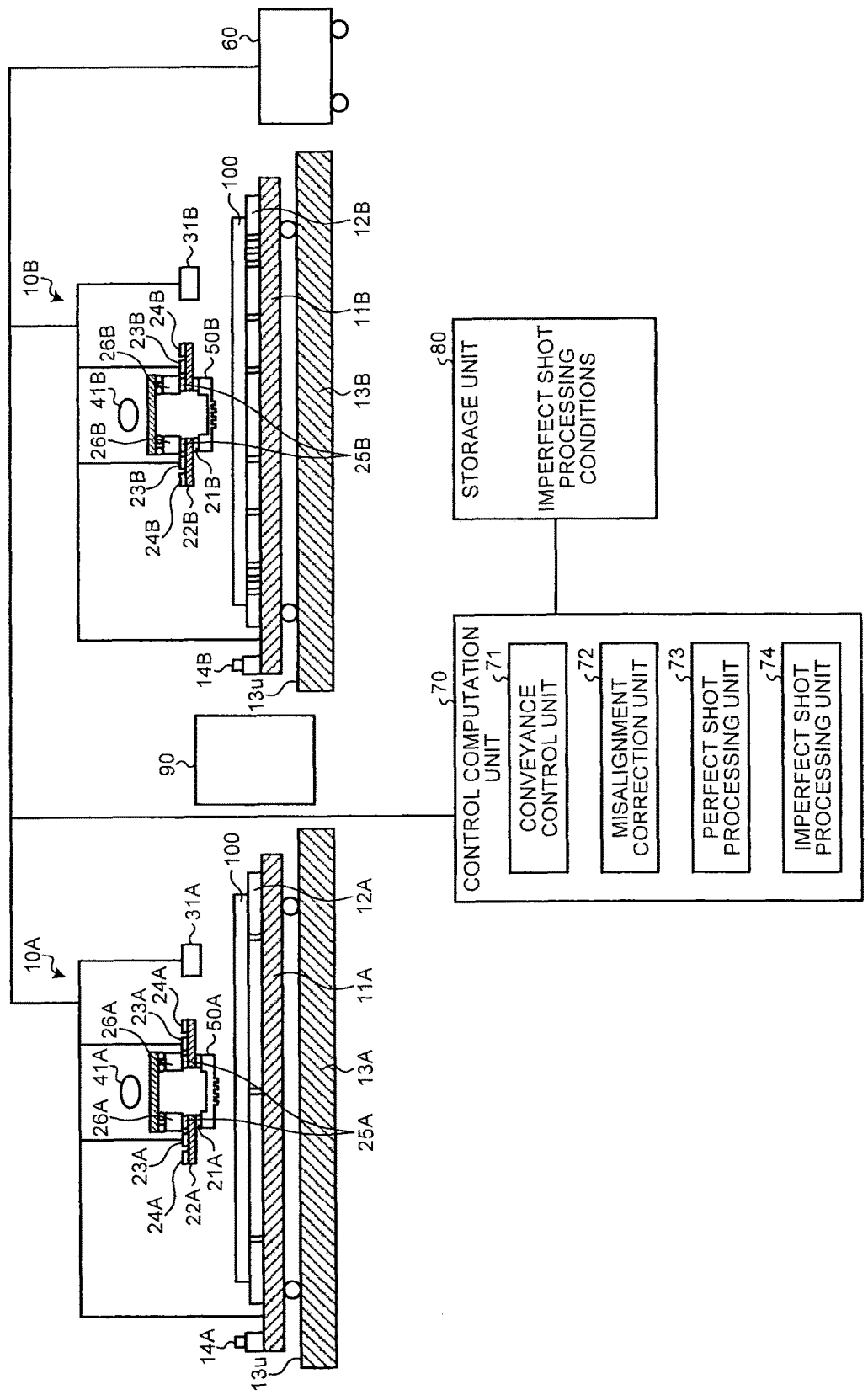
FIG. 11 is a cross-sectional view schematically illustrating an example of a configuration of an imprint apparatus according to a second embodiment.

FIG. 11 is a cross-sectional view schematically illustrating an example of a configuration of an imprint apparatus according to a second embodiment. The imprint apparatus further includes a buffer 90 to temporarily store the substrates 100 in addition to the imprint apparatus of the first embodiment. Here, the imprint units 10A, 10B perform processes in units of a lot. Thus, substrates 100 for which the processes at the imprint units 10A, 10B are terminated are temporarily stored in the buffer 90. The buffer 90 can store the substrates 100, the number of substrates 100 corresponding to that of the substrates 100 processed in one lot. The buffer 90 is provided between the imprint unit 10A for perfect shot and the imprint unit 10B for imperfect shot, for example. Note that the components that are the same as those in the first embodiment will be designated by the same reference numerals and the explanation thereof will not be repeated.

FIG. 12 is a flowchart illustrating an example of procedures of an imprint method according to the second embodiment. Similarly to steps S11 to S14 in FIG. 10 of the first embodiment, when the substrate storage of one lot is placed at a predetermined position near the imprint apparatus, a substrate 100 is conveyed from the substrate storage to the imprint unit 10A for perfect shot, and the imprint process in the step-and-repeat method is performed (steps S31 to S34).

The conveyor 60 then conveys the substrate 100 from the substrate stage 11A of the imprint unit 10A for perfect shot to the buffer 90 (step S35). This is performed according to an instruction from the conveyance control unit 71 of the control computation unit 70. Subsequently, it is determined whether the imprint process for perfect shot is performed for all the substrates 100 in the lot (step S36). If the imprint process for perfect shot is not terminated for all the substrates 100 (No in step S36), the process returns to step S31.

If the imprint process for perfect shot is terminated for all the substrates 100 (Yes in step S36), the conveyor 60 conveys a substrate 100 from the buffer 90 to the substrate stage 11B of the imprint unit 10B for imperfect shot (step S37). Subsequently, the substrate 100 placed by the vacuum chuck mechanism 12B of the imprint unit 10B for imperfect shot is subjected to vacuum chucking (step S38). Thereafter, the misalignment correction unit 72 of the control computation unit 70 calculates misalignment between the reference mark stands 14A, 14B, the templates 50A, 50B, and the substrate 100, and corrects the misalignment on the basis of the calculation result (step S39).

Subsequently, the imprint process in the step-and-repeat method is performed by the imprint unit 10B for imperfect shot (step S40). This process is the same as in step S18 in FIG. 10 of the first embodiment.

The conveyor 60 then conveys the substrate 100 from the substrate stage 11B of the imprint unit 10B for imperfect shot to the substrate storage (step S41). This is performed according to an instruction from the conveyance control unit 71 of the control computation unit 70. Subsequently, it is determined whether the imprint process for imperfect shot is performed for all the substrates 100 in the lot (step S42). If the imprint process for imperfect shot is not terminated for all the substrates 100 (No in step S42), the process returns to step S37. If the imprint process for imperfect shot is terminated for all the substrates 100 (Yes in step S42), the process is terminated.

Although the imprint process at the imprint unit 10B for imperfect shot is performed after the imprint process at the imprint unit 10A for perfect shot is performed in the explanation above, the order may be reversed.

According to the second embodiment, the same advantageous effects as those of the first embodiment can be obtained.

Third Embodiment

FIG. 13 is a cross-sectional view schematically illustrating a configuration of an imprint apparatus according to a third embodiment. The imprint apparatus is different from that of the first embodiment in that the same vacuum chuck mechanisms 12C are used by the imprint unit 10A for perfect shot and the imprint unit 10B for imperfect shot. Thus, the imprint unit 10A for perfect shot and the imprint unit 10B for imperfect shot have different templates 50A, 50B, but have the same vacuum chuck mechanisms 12C.

Figure 14A:
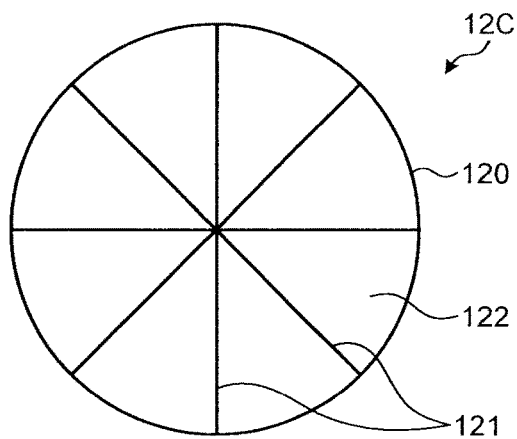
FIGS. 14A to 14C are top views illustrating an example of a configuration of a vacuum chuck mechanism according to the third embodiment.
Figure 14B:
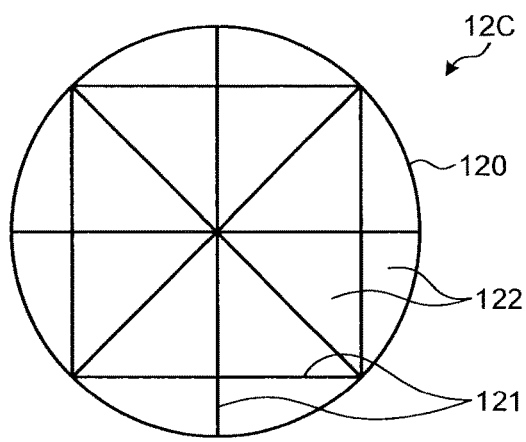
Figure 14C:
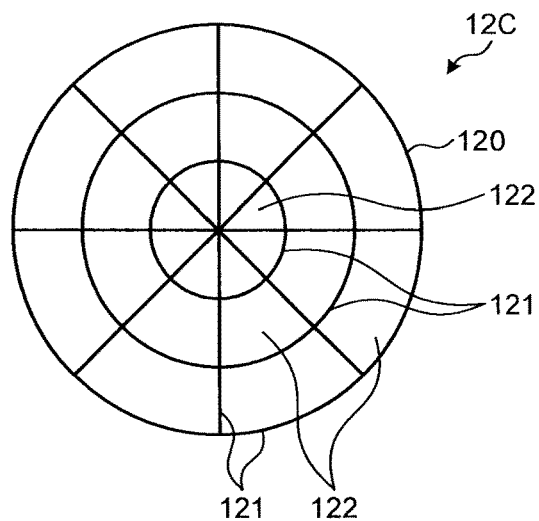

FIGS. 14A to 14C are top views illustrating an example of a configuration of the vacuum chuck mechanism according to the third embodiment. The vacuum chuck mechanism 12C illustrated in FIG. 14A has partition portions 121 formed radially from the center toward the edge of the plate member 120. The vacuum chuck mechanism 12C illustrated in FIG. 14B has a structure combining the radial partition portions 121 in FIG. 14A and partition portions 121 in parallel crosses. The vacuum chuck mechanism 12C illustrated in FIG. 14C has a structure combining the radial partition portions 121 in FIG. 14A and concentric partition portions 121. In FIGS. 14A to 14C, recessed portions 122 are formed between the partition portions 121.

Each of these vacuum chuck mechanisms 12C has a structure capable of securely holding the substrate 100 so that the substrate 100 is not raised at the edge while fixing the substrate 100 at the center of the plate member 120. As a result, the same vacuum chuck mechanisms 12C are used by both of the imprint unit 10A for perfect shot and the imprint unit 10B for imperfect shot.

Figures 15, 16:
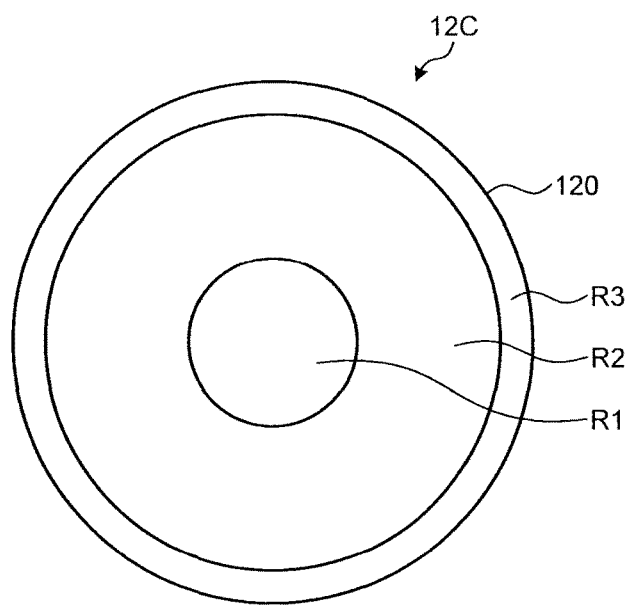
FIG. 15 is a diagram illustrating an example of dividing a plate member of a vacuum chuck into multiple regions.
FIG. 16 is a table illustrating an example of types of vacuum chucks to be applied to the respective regions in FIG. 15.

Note that vacuum chuck mechanisms 12C other than those in the examples above can be used. FIG. 15 is a diagram illustrating an example of dividing the plate member of a vacuum chuck mechanism into multiple regions, and FIG. 16 is a table illustrating an example of types of vacuum chucks to be applied to the regions in FIG. 15. As illustrated in FIG. 15, the plate member 120 is divided into a central region R1, an outer circumferential region R3, and an intermediate region R2 between the central region R1 and the outer circumferential region R3, for example. The sizes of the central region R1, the intermediate region R2, and the outer circumferential region R3 can be determined to be any sizes. Different types of vacuum chucks can be applied to the respective regions.

FIG. 16 illustrates examples of the combination. In a chuck A, partitions in parallel crosses are arranged to separate recessed portions in the central region R1 and the intermediate region R2, and concentric partitions are arranged to separate recessed portions in the outer circumferential region R3. In a chuck B, radial partitions are arranged to separate recessed portions in the central region R1, and a combination of radial partitions and concentric partitions are arranged to separate recessed portions in the intermediate region R2 and the outer circumferential region R3. In a chuck C, concentric partitions are arranged to separate recessed portions in the central region R1, radial grooves partitions are arranged to separate recessed portions in the intermediate region R2, and a combination of radial and concentric grooves partitions are arranged to separate recessed portions in the outer circumferential region R3. A chuck D has a structure in which a combination of radial partitions and partitions in parallel crosses are arranged to form recessed portions in the central region R1, and concentric partitions are arranged to form recessed portions in the intermediate region R2 and the outer circumferential region R3.

Note that FIG. 16 presents one example. Thus, any of partitions in parallel crosses, concentric partitions, radial partitions, a combination of concentric and radial partitions, and a combination of partitions in parallel crosses and radial partitions may be arranged in the central region R1, the intermediate region R2, and the outer circumferential region R3. Alternatively, partitions in other shapes may be arranged. Similarly to FIG. 6C, the recessed portions 122 may also be provided with support pins in the vacuum chuck mechanisms 12C.

Note that the components that are the same as those in the first embodiment will be designated by the same reference numerals and the explanation thereof will not be omitted. Furthermore, since the imprint method for the imprint apparatus having such a configuration is the same as that explained in the first embodiment, the explanation will not be omitted.

Furthermore, in the explanation above, a case in which the same vacuum chuck mechanisms 12C are used by the imprint units 10A, 10B is presented in contrast to the configuration of the first embodiment. This, however, can also be applied to vacuum chuck mechanisms 12C for the imprint units 10A, 10B in the configuration of the second embodiment.

According to the third embodiment, the imprint processes are performed by using the imprint units 10A, 10B having structures in which different templates 50A, 50B are used for the perfect shot regions $R_A$ and the imperfect shot regions $R_B$, and the vacuum chuck mechanisms 12C having the same structure are used for the perfect shot regions $R_A$ and the imperfect shot regions $R_B$. This eliminates the need for setting different vacuum chuck mechanisms for the imprint units 10A, 10B, which can obtain an advantageous effect of reducing the manufacture cost of the apparatus as compared to the first and second embodiments in addition to the advantageous effects explained in the first embodiment.

Figure 17:
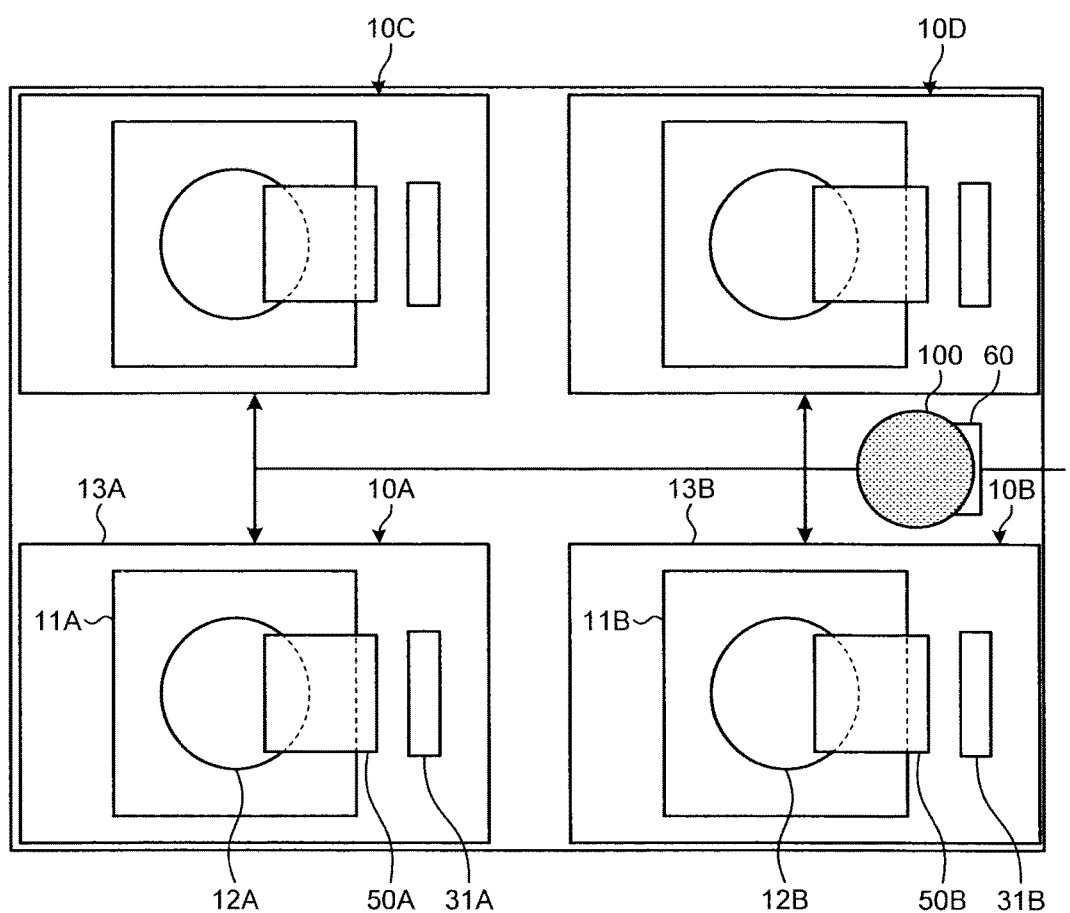
FIG. 17 is a top view schematically illustrating an example of an arrangement of imprint units of the imprint apparatus.

Although the number of imprint units 10A, 10B is two in the explanation above, multiple imperfect shot imprint units 10B and multiple imprint unit 10A for perfect shot may be provided. FIG. 17 is a top view schematically illustrating an example of an arrangement of imprint units of the imprint apparatus. In FIG. 17, two imprint units 10A, 10C for perfect shot and two imprint units 10B, 10D for imperfect shot are provided. In addition, a conveyor 60 capable of conveying substrates 100 between the imprint units 10A to 10D is provided in a manner movable between the imprint units 10A to 10D.

Figure 18A:
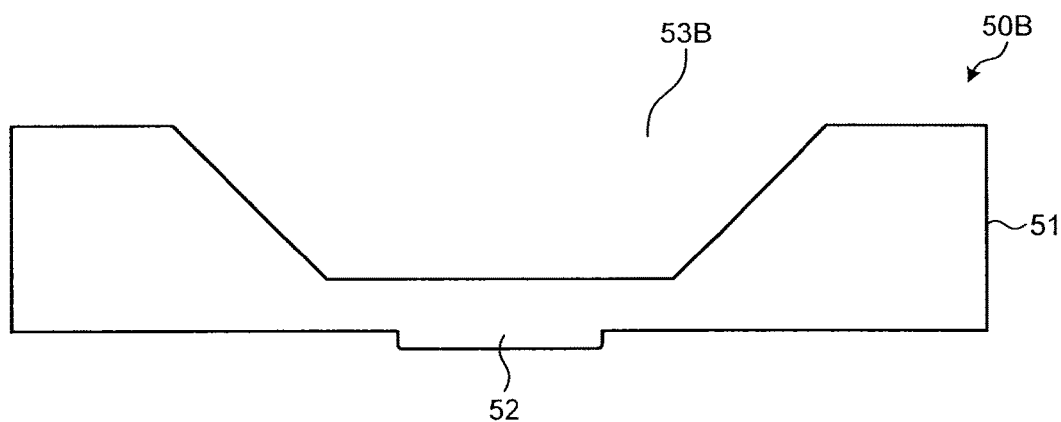
FIGS. 18A and 18B are cross-sectional views schematically illustrating another example of a configuration of a template.
Figure 18B:
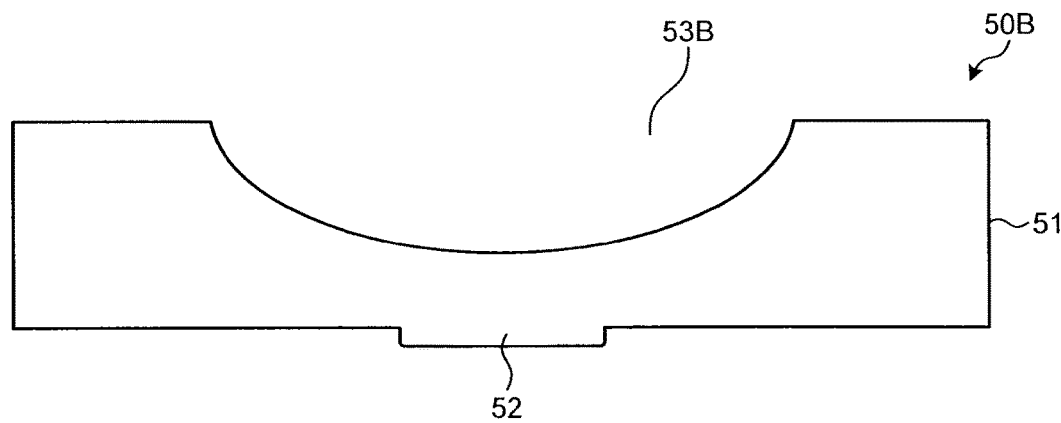

The shapes of the templates 50A, 50B are not limited to those illustrated in FIGS. 5 and 7. FIGS. 18A and 18B are cross-sectional views schematically illustrating another example of a configuration of a template. FIGS. 18A and 18B illustrate examples of the template 50B for imperfect shot. In FIG. 18A, sides forming the recessed portion 53B provided in the template substrate 51 have a tapered shape. In FIG. 18B, the recessed portion 53B provided in the template substrate 51 has a hemispherical shape. Similar shapes can also be applied to the template 50A for perfect shot. In this case, however, the thickness thereof under the recessed portion 53B may be made larger than that of the template 50B for imperfect shot.

Figure 19:
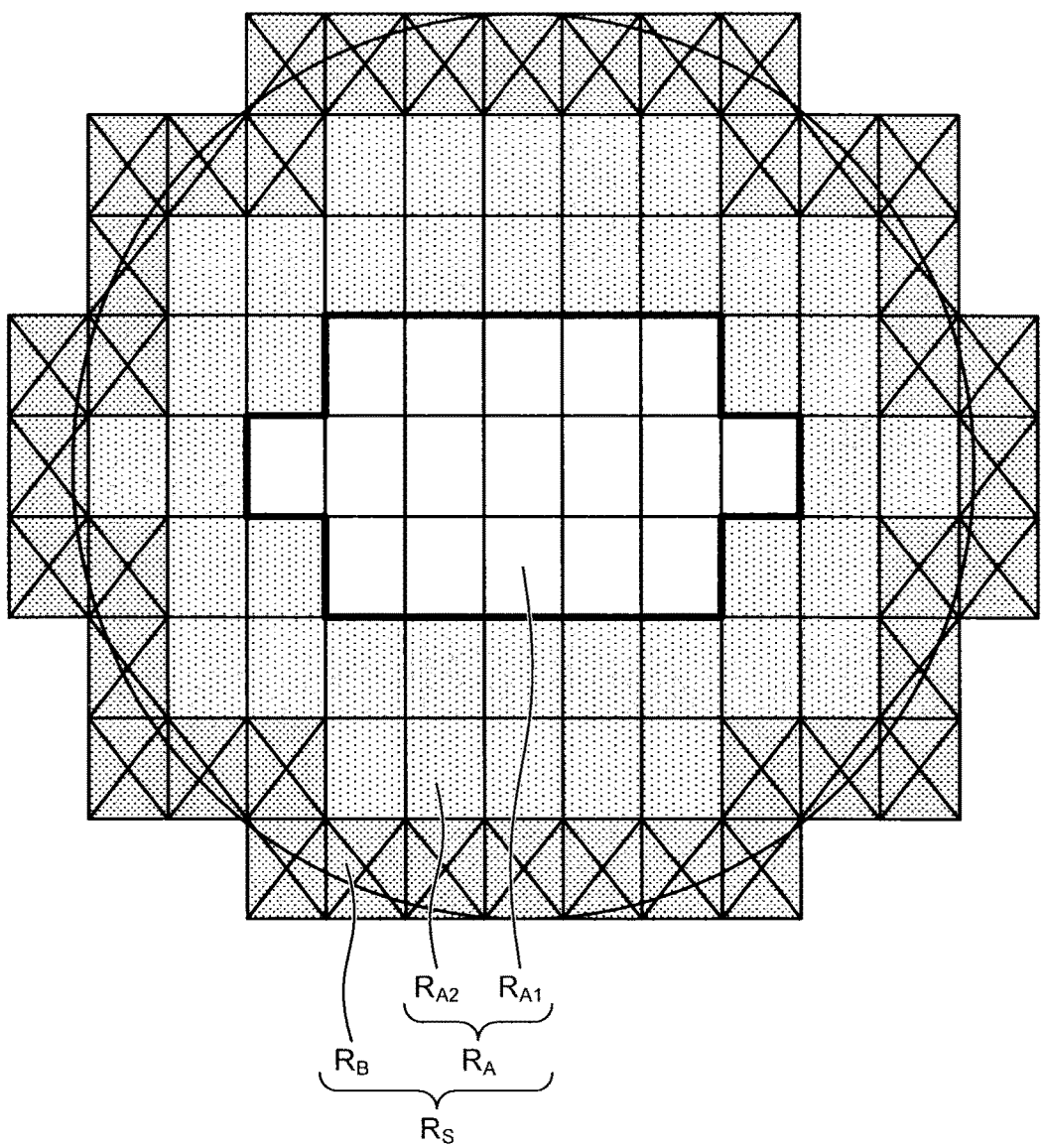
FIG. 19 is a diagram illustrating an example of shot regions on a substrate.

Although a case in which the imprint unit 10A for perfect shot and the imprint unit 10B for imperfect shot are provided as the imprint units 10A, 10B is presented in the explanation above, the imprint units are not limited thereto. FIG. 19 is a diagram illustrating an example of shot regions on a substrate. As illustrated in FIG. 19, perfect shot regions $R_A$ may further be divided into two regions, so that the entire substrate is divided into three regions. Herein, the perfect shot regions $R_A$ are divided into first perfect shot regions $R_{A1}$ around the center of the substrate 100 and second perfect shot regions $R_{A2}$ closer to the imperfect shot regions $R_B$. Imprint units are provided respectively for the first perfect shot regions $R_{A1}$, the second perfect shot regions $R_{A2}$, and the imperfect shot regions $R_B$.

Figure 20:
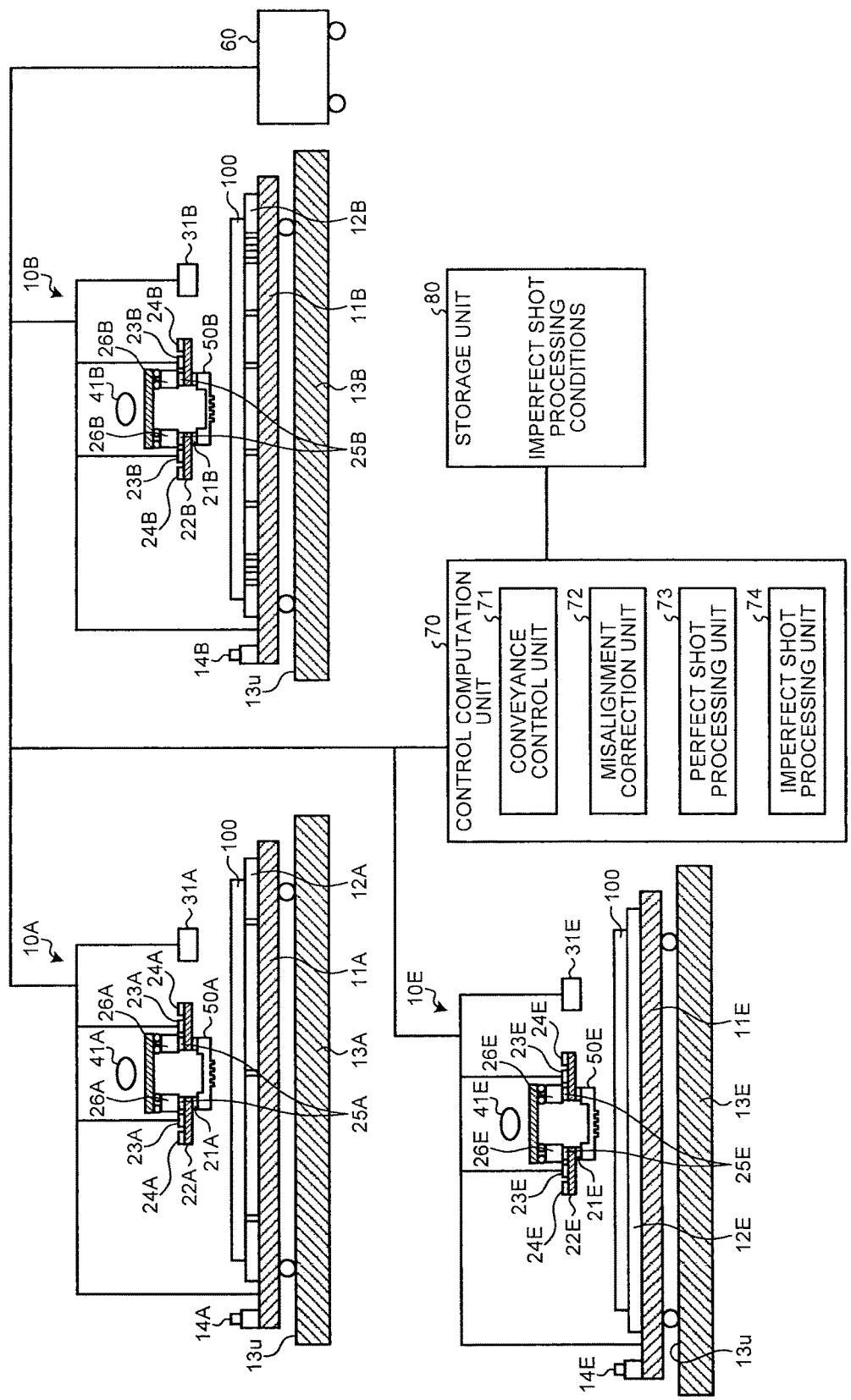
FIG. 20 is a cross-sectional view schematically illustrating an example of a configuration of an imprint apparatus in which shot regions are categorized as in FIG. 19.

FIG. 20 is a cross-sectional view schematically illustrating an example of a configuration of an imprint apparatus in which shot regions are categorized as in FIG. 19. The imprint apparatus includes a first imprint unit 10A for perfect shot configured to perform an imprint process on the first perfect shot regions $R_{A1}$ in FIG. 19, a second imprint unit 10E for perfect shot configured to perform an imprint process on the second perfect shot regions $R_{A2}$, and an imprint unit 10B for imperfect shot configured to perform an imprint process on the imperfect shot regions $R_B$. Here, the first imprint unit 10A for perfect shot and the imprint unit 10B for imperfect shot are the same as the imprint unit 10A for perfect shot and the imprint unit 10B for imperfect shot in the first embodiment. In the second imprint unit 10E for perfect shot, the depth of a recessed portion of a template 50E is between the depth of the recessed portion of the template 50A in the first imprint unit 10A for perfect shot and the depth of the recessed portion of the template 50B in the imprint unit 10B for imperfect shot. In addition, the vacuum chuck mechanisms 12A, 12B, 12E may be different for the respective imprint units 10A, 10B, 10E as in the first embodiment, or may be the same for some imprint units 10A, 10B, 10E as in the second embodiment.

Furthermore, in the configuration of FIG. 20, multiple first imprint units 10A for perfect shot, multiple second imprint units 10E for perfect shot, and multiple imprint units 10B for imperfect shot may be provided. Furthermore, four or more types of imprint units may be provided, and the number of each type of imprint units may be more than one. As a result of providing imprint units of different types in this manner, it is possible to perform an imprint process suitable for the position and to prevent occurrence of defects in the imprint process.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint apparatus comprising:
a first imprint unit;
a second imprint unit;
a conveyor configured to convey a substrate between the first imprint unit and the second imprint unit;
a control computation unit configured to control imprint processes in the first imprint unit and the second imprint unit; and
a storage unit, wherein
the first imprint unit includes:
  a first suction mechanism configured to hold the substrate on a first substrate holder, the first suction mechanism including first recessed portions, first partitions, a first suction passage, and first exhaust unit, the first recessed portions being arranged on a face of a first plate member on which the substrate is to be placed, the first partitions separating the first recessed portions from one another, the first suction passage being connected to all the first recessed portions and provided inside the first plate member, the first exhaust unit being connected to the first suction passage; and
  a first template having a first recessed region on one face of a first template substrate and having a first imprint surface on which a concavo-convex pattern is arranged on the other face, the first imprint surface being arranged at a position corresponding to the first recessed region on the other face,
the second imprint unit includes:
  a second suction mechanism configured to hold the substrate on a second substrate holder, the second suction mechanism including second recessed portions, second partitions, second suction passages, and an second exhaust unit, the second recessed portions being arranged on a face of a second plate member on which the substrate is to be placed, the second partitions separating the second recessed portions from one another, the second suction passages being connected to the second recessed portions on a one-to-one basis and provided inside the second plate member, the second exhaust unit being connected to the second suction passages, the second recessed portions are capable of being exhausted independently; and
  a second template having a second recessed region on one face of a second template substrate and having a second imprint surface on which a concavo-convex pattern is arranged on the other face, the second imprint surface being arranged at a position corresponding to the second recessed region on the other face, and
a depth of the first recessed region of the first template is shallower than a depth of the second recessed region of the second template,
a size of the first imprint surface is the same as a size of the second imprint surface,
the first partitions are arranged in parallel crosses in the first suction mechanism of the first imprint unit,
the second partitions are arranged concentrically in the second suction mechanism of the second imprint unit and arranged at higher density at the edge of the second plate member,
the control computation unit selects the second recessed portions to apply vacuum drawing based on positions of shot regions, and controls on/off of vacuum drawing of each of the second recessed portions based on a result of the selection,
the first imprint unit is used for perfect shot regions where the first imprint surface does not stick out from the substrate when the first template is pressed against the substrate,
the second imprint unit is used for imperfect shot regions where the second imprint surface sticks out from the substrate when the second template is pressed against the substrate,
the storage unit stores, for each of the imperfect shot regions, an imperfect shot processing condition indicating relation between the imperfect shot region and the second recessed portions to be exhausted when the second template is pressed against the imperfect shot region, the control computation unit obtains the imperfect shot processing condition associated with the imperfect shot region against which the second template is pressed from the storage unit, and controls exhaust of the second recessed portions of the second suction mechanism in the second imprint unit on the basis of the imperfect shot processing condition, a density of the first partitions of the first suction mechanism is lower than a density of the second partitions of the second suction mechanism, in the second suction mechanism, the second passages are higher in density at part of the edge of the second plate member than in the second plate member other than the edge, the first imprint unit has multiple imprint units having the same configuration as the first imprint unit, and the second imprint unit has multiple imprint units having the same configuration as the second imprint unit.

2. The imprint apparatus according to claim 1, wherein, in the second suction mechanism, the second partitions are higher in density at the edge of the second plate member than at a center, and in the first suction mechanism, the first partitions are not different in density between an edge and a center of the first plate member.

3. An imprint apparatus comprising:

a first imprint unit;

a second imprint unit;

a conveyor configured to convey a substrate between the first imprint unit and the second imprint unit;

a control computation unit configured to control imprint processes in the first imprint unit and the second imprint unit, and a storage unit, wherein the first imprint unit includes:
  a first suction mechanism configured to hold the substrate on a first substrate holder, the first suction mechanism including first recessed portions, first partitions, a first suction passage, and an first exhaust unit, the first recessed portions being arranged on a face of a first plate member on which the substrate is to be placed, the first partitions separating the first recessed portions from one another, the first suction passage being connected to all the first recessed portions and provided inside the first plate member, the first exhaust unit being connected to the first suction passage; and
  a first template having a first recessed region on one face of a first template substrate and having a first imprint surface on which a concavo-convex pattern is arranged on the other face, the first imprint surface being arranged at a position corresponding to the first recessed region on the other face, the second imprint unit includes:
  a second suction mechanism configured to hold the substrate on a second substrate holder, the second suction mechanism including second recessed portions, second partitions, second suction passages, and an second exhaust unit, the second recessed portions being arranged on a face of a second plate member on which the substrate is to be placed, the second partitions separating the second recessed portions from one another, the second suction passages being connected to the second recessed portions on a one-to-one basis and provided inside the second plate member, the second exhaust unit being connected to the second suction passages, the second recessed portions are capable of being exhausted independently; and
  a second template having a second recessed region on one face of a second template substrate and having a second imprint surface on which a concavo-convex pattern is arranged on the other face, the second imprint surface being arranged at a position corresponding to the second recessed region on the other face, and a depth of the first recessed region of the first template is shallower than a depth of the second recessed region of the second template, a size of the first imprint surface is the same as a size of the second imprint surface, the first partitions are arranged in parallel crosses in the first suction mechanism of the first imprint unit, the second partitions are arranged concentrically in the second suction mechanism of the second imprint unit and arranged at higher density at the edge of the second plate member, the control computation unit selects the second recessed portions to apply vacuum drawing based on positions of shot regions, and controls on/off of vacuum drawing of each of the second recessed portions based on a result of the selection, the first imprint unit is used for perfect shot regions where the first imprint surface does not stick out from the substrate when the first template is pressed against the substrate, the second imprint unit is used for imperfect shot regions where the second imprint surface sticks out from the substrate when the second template is pressed against the substrate, the storage unit stores, for each of the imperfect shot regions, an imperfect shot processing condition indicating relation between the imperfect shot region and the second recessed portions to be exhausted when the second template is pressed against the imperfect shot region, the control computation unit obtains the imperfect shot processing condition associated with the imperfect shot region against which the second template is pressed from the storage unit, and controls exhaust of the second recessed portions of the second suction mechanism in the second imprint unit on the basis of the imperfect shot processing condition, a density of the first partitions of the first suction mechanism is lower than a density of the second partitions of the second suction mechanism, in the second suction mechanism, the second passages are higher in density at part of the edge of the second plate member than in the second plate member other than the edge, and the first imprint surface of the first template and the second imprint surface of the second template have the same pattern formed thereon.

4. The imprint apparatus according to claim 3, wherein, in the second suction mechanism, the second partitions are higher in density at the edge of the second plate member than at a center, and in the first suction mechanism, the first partitions are not different in density between an edge and a center of the first plate member.

* * * * *